US 6,551,924 B1

(12) United States Patent
Dalton et al.

(10) Patent No.: US 6,551,924 B1
(45) Date of Patent: Apr. 22, 2003

(54) POST METALIZATION CHEM-MECH POLISHING DIELECTRIC ETCH (75) Inventors: Timothy J. Dalton, Ridgefield, CT (US); John P. Hummel, Millbrook, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/432,683

(22) Filed: Nov. 2, 1999

(51) Int. Cl.[7] .......................................... H01L 21/4763
(52) U.S. Cl. ..................... 438/637; 438/638; 438/619; 438/700; 438/629
(58) Field of Search ................................ 438/692, 700, 438/706, 740, 638, 637, 687, 396, 574, 619, 629, 648, 411, 421, 422, 598, 667, 669, 695

(56) References Cited

U.S. PATENT DOCUMENTS

| 4,789,648 | A | | 12/1988 | Chow et al. ............... 437/225 |
| 4,855,015 | A | * | 8/1989 | Douglas .................... 156/626 |
| 4,944,836 | A | | 7/1990 | Beyer et al. ............... 156/645 |
| 5,071,518 | A | | 12/1991 | Pan ........................... 205/122 |
| 5,397,741 | A | | 3/1995 | O'Connor et al. .......... 437/187 |
| 5,403,779 | A | | 4/1995 | Joshi et al. ................ 437/190 |
| 5,426,330 | A | | 6/1995 | Joshi et al. ................ 257/752 |
| 5,585,673 | A | | 12/1996 | Joshi et al. ................ 257/751 |
| 5,612,254 | A | | 3/1997 | Mu et al. ................... 437/195 |
| 5,739,579 | A | * | 4/1998 | Chiang et al. ............. 257/635 |
| 5,817,579 | A | * | 10/1998 | Ko et al. ................... 438/740 |
| 5,824,599 | A | | 10/1998 | Schacham-Diamand et al. ........................... 438/678 |
| 5,872,058 | A | | 2/1999 | Van Cleemput et al. ... 438/692 |
| 5,872,401 | A | | 2/1999 | Huff et al. ................. 257/758 |
| 5,888,901 | A | | 3/1999 | Grivna ....................... 438/637 |
| 5,900,668 | A | | 5/1999 | Wollesen ................... 257/522 |
| 6,093,633 | A | * | 7/2000 | Matsumoto ................ 438/622 |
| 6,096,633 | A | * | 8/2000 | Hsu ........................... 438/622 |
| 6,110,792 | A | * | 8/2000 | Bronner et al. ............ 438/386 |
| 6,150,268 | A | * | 11/2000 | Iacoponi et al. ........... 438/685 |
| 6,159,845 | A | * | 12/2000 | Yew et al. ................. 438/637 |
| 6,201,303 | B1 | * | 3/2001 | Ngo et al. ................. 257/768 |
| 6,211,056 | B1 | * | 4/2001 | Begley et al. ............. 438/619 |

FOREIGN PATENT DOCUMENTS

JP          56-122129      *   9/1981

* cited by examiner

Primary Examiner—Olik Chaudhuri
Assistant Examiner—Fernando Toledo
(74) Attorney, Agent, or Firm—H. Daniel Schnurmann (57) ABSTRACT A method for etching an insulating layer without damage to the conducting layer and associated liner layer within the insulating layer. A dielectric layer is deposited on a semiconductor substrate and then patterned. A liner layer and a conducting layer are then deposited within the patterned dielectric. A passivating layer is deposited on top of the conducting layer after the conducting layer has been planarized through chemical-mechanical polishing while simultaneously etching the dielectric layer through a process that does not damage the underlying conducting and liner layers. The insulating layer is preferably a dielectric such as silicon dioxide and the liner layer is tantalum, tantalum nitride or a combination of the two. The passivating layer preferably consists of carbon and fluorine bound up in various chemical forms. The conducting layer preferably consists of copper. Recipes for simultaneously forming the passivating layer and etching the dielectric layer, and for removing the passivating layer without damaging the underlying conducting and liner layers are provided.

29 Claims, 8 Drawing Sheets

POST METALIZATION CHEM-MECH POLISHING DIELECTRIC ETCH

FIELD OF THE INVENTION

This invention relates to semiconductor integrated circuit processing, and more particularly to a method for fabricating interconnect structures in quartz or related dielectric films and then selectively removing the dielectric without damaging the conducting layers.

BACKGROUND OF THE INVENTION

Fabrication of interconnect structures for semiconductors is conventionally accomplished using silicon dioxide ($SiO_2$) as the dielectric and Al or Cu as the metallic conducting film. Current processes are optimized for these materials. However, new dielectrics are becoming available with more advantageous properties such as a reduced dielectric constant which can increase the speed of integrated circuits. The processing of these new dielectrics, however, has not yet been optimized.

Various films ("processing aids") are used in the processing of low dielectric constant (k) materials, particularly to protect the low-k material from erosion during a chemical-mechanical polish (CMP) process. These "processing aid" films have a higher dielectric constant than the low-k films, and if left in the final structure, would increase the final effective dielectric constant, thus degrading the effect of the low dielectric constant insulator. Removing these films after they have served the integration purpose is thus desirable.

Reactive ion etching is one known method of removing dielectric films, but results in either the sputtering of exposed copper, removal of exposed liners, or contamination of the dielectric surface by redeposition of copper sputtered during the etch process. Additionally, damage or modification of the underlying protected low-k dielectric may occur due to exposure to the plasma process. With current copper liner metallurgy, etch of "processing aid" films (such as silicon dioxide or silicon nitride) can also etch the liner materials since these liners are etched in the same chemistries as the "processing aid" films.

Plasma etching is a commonly used technique for semiconductor manufacturing. Plasma etching consists of the application of an electromagnetic energy field to a suitable reactor vessel containing desired feed gas species and a substrate that is to be etched (typically a Si wafer, GaAs wafer or other such substrate). The choice of feed gas species and their rate of application, the amount of electromagnetic energy applied, and the configuration of the reactor vessel, all work together to determine the specific etch characteristics for that particular process. These characteristics include how quickly and uniformly different materials etch, and how the microstructure (profile/shape) of the materials evolves in time. The etch processes work by a number of simultaneous etching mechanisms, such as physical sputtering, spontaneous chemical etching, and chemical assisted sputtering.

It is known that certain feed gases or mixtures of feed gases are better suited to etch certain materials than other feed gases or mixtures. Thus, one knowledgeable in the art may choose gases containing certain elemental species because they are better suited for a particular problem. Still, the specific choice of feed gases to do a specific job is not automatic. Instead, the feed gas or mixture and rate of application are carefully chosen to balance a number of competing factors in the etch process evolution.

One desirable behavior in etch processes is a selective etch. Plasma etching possesses the ability to remove one or more materials that are desired to be removed, while not removing one or materials that are desired to remain in place. Some materials combinations easily confer the ability for one material to be removed selectively to others. For example, it is known that organic polymers may be removed selectively to silicon dioxide using a plasma containing oxygen feed gas. Other materials combinations present more of a problem to etch selectively. This often arises because the feed gas or mixture that etches one material will also etch other materials.

During the construction of integrated circuit devices, it is often necessary to construct structures where a conducting material or conducting materials are placed within an insulating layer in a three dimensional fashion. Further, this (these) conduction material(s) are often interconnected. For certain reasons, such as performance and ease of construction, it is sometimes desirable to build structures in one insulating material, but then replace it with another insulating material. In this case, it is desirable to be able to selectively remove the insulating material without damaging, degrading, or changing the conducting material (s).

In particular, a structure may be built in which the insulating material is chosen from materials such as silicon dioxide, silicon nitride, fluorinated silicon glass, undoped silicon glass, phosphorus silicon glass, boron-phosphorous silicon glass, and associated insulators in stoichiometric or non-stoichiometric forms. This structure may further be processed by known methods so that the insulating layer contains a conducting layer that consists of a conducting metal (e.g., Cu, Al, W, Ag) or conducting semiconductor (e.g., Si, Ge, C with appropriate impurities) and its associated "liner" layers (which are often refractory metals (Ta, Ti, W), refraction metal nitrides (TaN, TiN, WN), refractory metal alloys (TaSiN), or a combination of these materials). To replace the insulating material with another material, it is desirable to have an etch process that can remove the insulator without removing, damaging, or degrading the conducting layer or its associated "liner" material(s). If incorrect conditions are used, then the conducting layer(s) and its' (their) associated liner layer(s) can be eroded, leaving a small pointed region of conductor.

SUMMARY OF THE INVENTION

In view of the above, the protection of exposed conductor and liner surfaces is accomplished by deposition of a plasma generated polymer film during a dielectric etch process. A plasma process chemistry is chosen to allow etching of the removable dielectric film while depositing a protective film on the exposed metal surfaces. This protective film will prevent subsequent etching or sputtering of the exposed conductor and liner materials. The polymer film on the metal surfaces can be removed in a subsequent process step by a technique that will not damage the exposed conductor surface, such as a down stream plasma asher, chemical dry etcher, low-bias reactive ion etcher, or in a suitable wet process.

As the sacrificial dielectric film is etched to endpoint, a protective film deposited on the now-exposed underlying low-k film (if present) will prevent plasma modification of this underlying dielectric. This is particularly critical to low-k systems such as Hydrogen Silsesquioxane (HSSQ) or Methylsilsesquioxane (MSSQ), which can be substantially modified to give a higher dielectric constant film. The process that removes the protective polymer from the conductor or liner surfaces will also remove it from the low-k film surface.

These and other features and advantages of the invention will become apparent upon a review of the following detailed description of the presently preferred embodiments of the invention, when viewed in conjunction with the appended drawings.

BRIEF DESCRIPTION OF THE DRAWINGS

FIGS. 1a–1d show the prior art process flow for the formation of a single damascene starting structure.

FIGS. 2a–2d are a process flow for the formation of a single damascene structure according to the invention.

FIGS. 3a–3c are a process flow of the prior art formation of a via-up single damascene structure.

FIGS. 4a–4c are a process flow for the formation of a via-up dual damascene structure according to the invention.

FIGS. 7a–7d are a process flow for the formation of a prior art hard mask layer over a low dielectric constant layer.

DETAILED DESCRIPTION OF THE PRESENTLY PREFERRED EMBODIMENTS OF THE INVENTION

To accomplish the removal of the dielectric layer without degradation of the conducting layer, all of the different etch mechanisms (physical sputtering, spontaneous chemical etching, and chemical assisted sputtering) should be controlled such that the dielectric is removed while the conducting layer is not. The material(s) of the conducting layer are thus "passivated" by the plasma to prevent its (their) loss. One presently preferred method for accomplishing this is to passivate the conducting layer and its associated "liner" layers by selectively covering these layers with a material from the plasma, while selectively not covering the insulating material with material from the plasma. This may be accomplished by a judicious choice of feed gases and their rate of application, the amount of electromagnetic energy applied, and the configuration of the reactor vessel. As described in greater detail below, several embodiments of this method of the invention are contemplated. Line-only single damascene, via-up dual damascene, line-up dual damascene, and high dielectric constant layer embodiments are provided.

Line-Only Single Damascene

Referring first to FIGS. 1a–1d, a starting single damascene structure is fabricated by methods generally known in the art. The structure consists of a conducting layer 60 and its associated liner layer 50, which are embedded within an insulating layer 20. In one preferred embodiment of the invention, the conducting metal is Cu, and the associated liner layer 50 consists of a thin layer of Tantalum Nitride (TaN), followed by a thin layer of Tantalum (Ta), and then a Copper (Cu) seed layer. The details of forming the liner layer 50 are disclosed in commonly owned co-pending application Ser. No. 08/497,065, now abandoned, and replaced by Ser. No. 08/896,925 and Ser. No. 09/370,003, the contents of which are hereby incorporated herein by reference. The method for fabricating this known starting structure is illustrated in FIGS. 1(a)–(d), and includes the following steps:

1. Dielectric deposition & photolithographic definition of a pattern (FIG. 1(a)).
2. Plasma etching of the pattern into the dielectric (FIG. 1(b)).
3. Liner deposition & conducting layer deposition (FIG. 1(c)).
4. Metal & liner planarization by chemical mechanical planarization (FIG. 1(d)).

Figures 1, 1A, 1D:
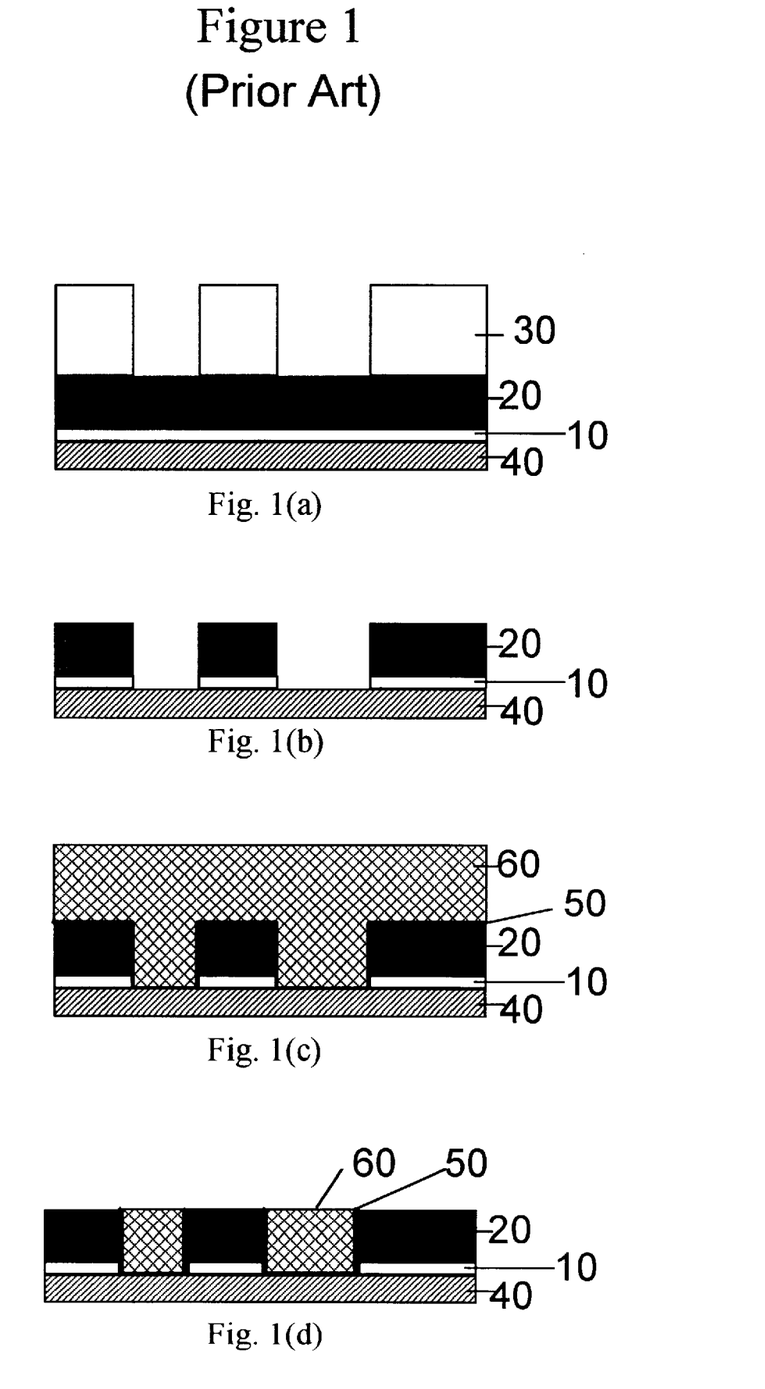

A more detailed description of the formation of the structure shown in FIG. 1 is provided in commonly owned U.S. Pat. No. 4,944,836, entitled "Chem-Mech Polishing Method For Producing Coplanar Metal/Insulator Films On A Substrate" and U.S. Pat. No. 4,789,648, entitled "Method For Producing Coplanar Multi-Level Metal/Insulator Films On A Substrate And For Forming Patterned Conductive Lines Simultaneously With Stud Vias," the contents of which are incorporated herein by reference.

A summary of the process flow proceeds as follows. An optional etch stop layer 10 and dielectric layer 20 are deposited onto a substrate 40. The resulting structure is patterned as necessary with a photoresist layer 30, as shown in FIG. 1(a). The photoresist pattern is transferred into the dielectric layer 20 and optional etch stop layer 10 in a manner generally known in the art. The photoresist 30 is then stripped in a conventional manner, as shown in FIG. 1(b). In FIG. 1(c), a liner material 50 and conducting material 60 are deposited onto the structure shown in FIG. 1(b). The conducting layer 60 and liner layer 50 are then planarized via a CMP process to form the desired pattern of conductor 60 in insulating layer 20, shown in FIG. 1(d).

Figures 2, 2A, 2D:
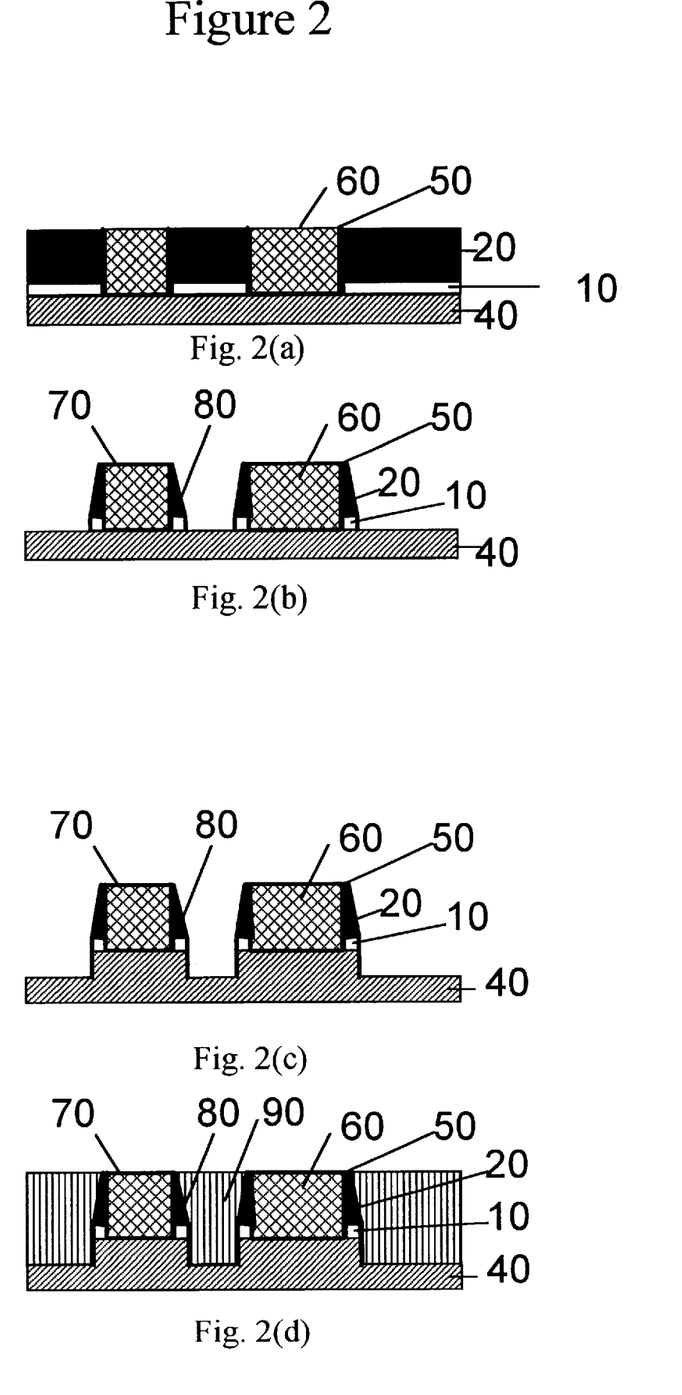

Continuing with the structure shown in FIGS. 1(d) and 2(a), the dielectric 20 and etch stop 10 layers are then selectively removed. This removal is preferably accomplished using a plasma etching technique in a commercially available plasma etch tool, such as the High Density Plasma (HDP) Oxide Etcher sold by Applied Materials Corp. of Santa Clara, Calif. To do this, a mixture of feed gases consisting of Ar, $C_2F_6$, and cyclo-$C_4F_8$ are employed, at an application rate of 150, 10, and 10 standard cubic centimeters per minute (SCCM), respectively. The reactor vessel (not shown) is configured such that the pressure within it is at 8 mTorr, with the roof at a temperature of 220° C., the walls at 215° C., the wafer pedestal at 5° C., the He backside cooling pressure at 15 Torr, and the applied electromagnetic energy divided between 1200 Watts on the plasma source inductive coil and 1000 watts on the wafer pedestal.

The etch process proceeds to selectively remove the dielectric layer 20 and etch stop layer 10, as shown in FIG. 2(b). The conductor 60 and liner 50 layers are protected by the deposition of a passivating layer 70. A self-aligned side wall spacer 80 of dielectric layer 20 and optional etch stop layer 10 are also formed as a by-product of this process. The insulating material is then removed until it is down to the bottom of the conducting layer 60 (see FIG. 2(b)). Alternatively, additional material may be removed from the substrate 40 such that the depth of removal is beneath the depth of the conductor 60 and liner 50 layers, as shown in FIG. 2(c). The removed dielectric is then replaced by another dielectric layer 90 with properties different from removed dielectric layer 20 and optional etch stop 10 to yield the structure shown in FIG. 2(d).

The conducting layer 60 and its associated liner layer 50 are left completely intact and are encased within a protective layer that consists of C and F bound in various chemical forms. Other known processes to remove dielectric use an organic dielectric, which can easily be removed with an $O_2$ ash. However, this process may oxidize a Cu conductor, and will not form a self-aligned sidewall spacer, which helps to provide structural integrity when the dielectric is removed.

In an alternate embodiment of the invention, prior to deposition of dielectric layer 90, the passivating layer 70 may be removed. The removal can be accomplished in many different manners. One presently preferred technique consists of removing the passivating layer 70 within the same reactor vessel used to do the plasma etching process. In this case, $O_2$ is applied at a rate of 300 SCCM, and the vessel configured such that it is at 15 mTorr pressure, with an applied power of 2500 W on the source coil, and 300 W on the wafer pedestal, with all other parameters remaining unchanged from the etch process. The etching proceeds until the passivating layer 70 is removed. This process does not greatly oxidize a copper conductor due to the low temperature and bias power employed. Other preferred techniques consist of removing the passivating layer 70 using feed gas mixtures consisting of gases chosen from the following list ($O_2$, $N_2$, $H_2$, $NH_3$, $N_2H_2$, $CF_4$, $CO_2$, $CO$, $CH_4$, $C_2H_2$, $C_2H_4$) in an reactor such as used for the plasma etch process, or in another suitable reactor.

In one embodiment, the dielectric layer 20 is removed to a depth concurrent with the bottom of the conductor layer 60. In an alternate embodiment, the dielectric layer 20 is removed to a depth non-concurrent with the bottom of the conductor 60, particularly if that depth is deeper than the conductor depth. At this point, the resulting structure may be filled with a new dielectric to replace the removed dielectric. The new dielectric is preferably chosen to have certain key properties that the removed dielectric did not have, such as a lower dielectric constant.

Via-Up Dual Damascene

This embodiment of the invention begins with a known structure consisting of two conducting layers built into a conventional dielectric material. One layer, the bottom layer, is a conducting layer consisting of lines of conductor, while the top layer consists of interconnections ("vias") to another layer.

Figures 3, 3A, 3C:
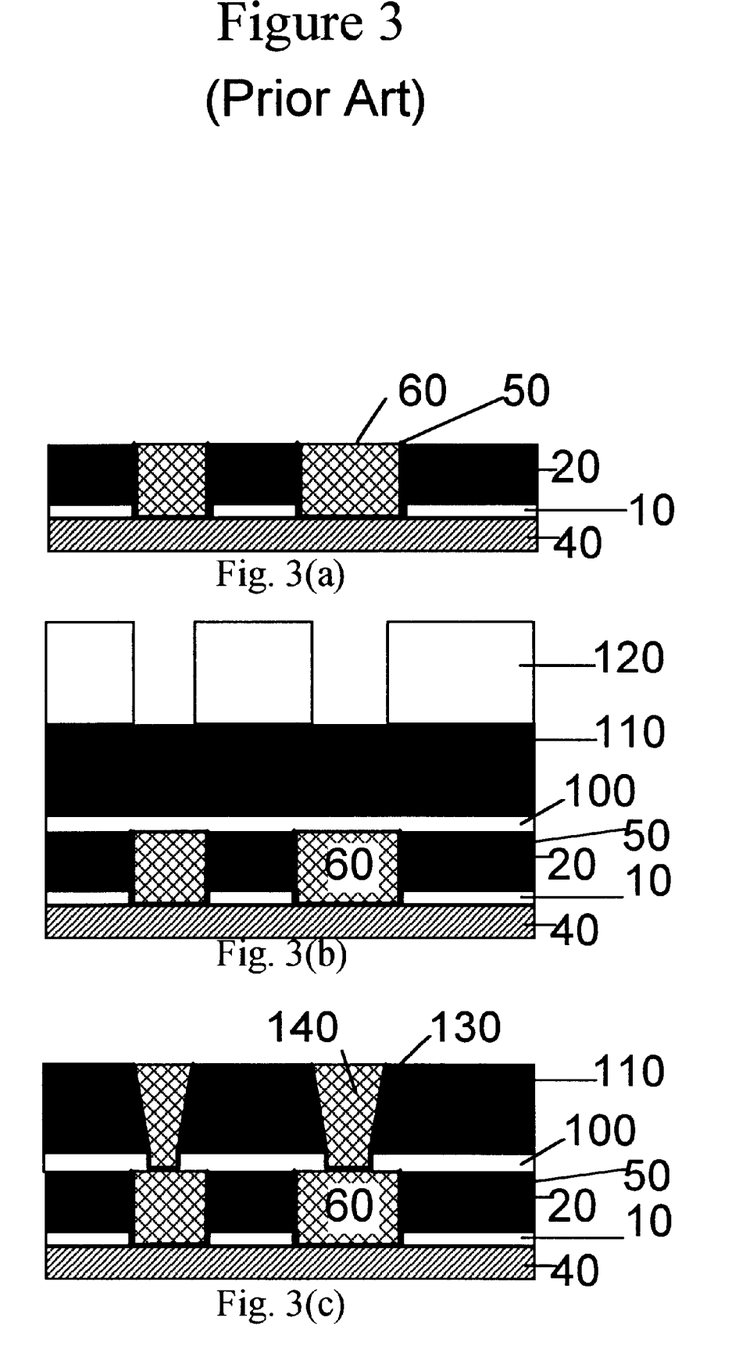
Figures 4, 4A, 4C:
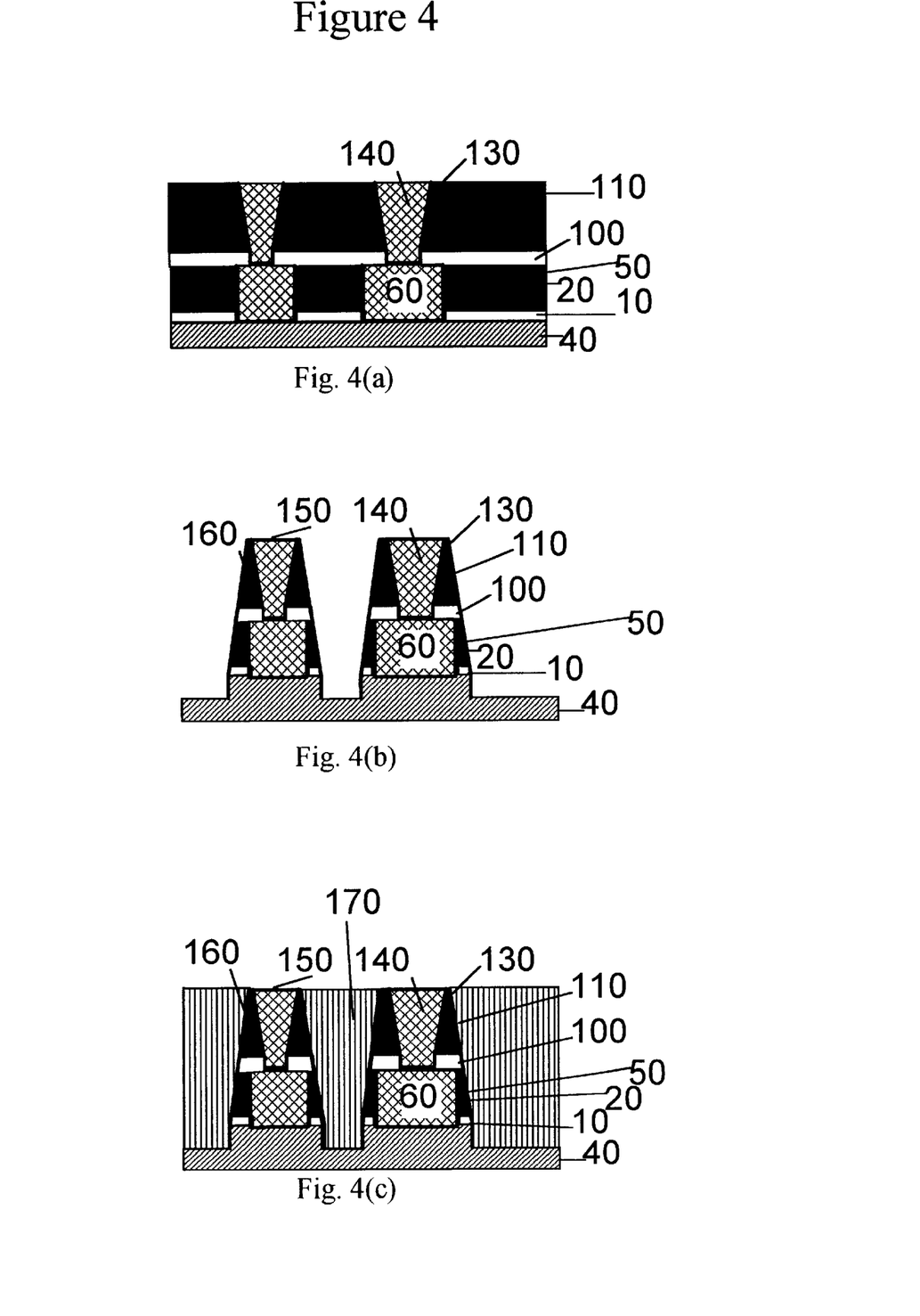

A process flow for this embodiment of the invention is shown in FIGS. 3 and 4. The starting structure shown in FIGS. 3(*a*)–(*c*) proceeds as described above in connection with FIG. 1. After creating the structure shown in FIG. 3(*a*), an optional etch stop layer 100 and a via dielectric layer 110 are deposited, and patterned with photoresist 120 as shown in FIG. 3(*b*). The photoresist pattern is transferred into the dielectric layer 110 and optional etch stop layer 100 in a manner generally known in the art. A liner layer 130 and conductor layer 140 are then deposited as shown in FIG. 3(*c*). The conductor 140 and liner 130 layers are planarized using CMP to form a desired conductor pattern in layer 110, as shown in FIG. 3(*c*).

Referring now to FIG. 4(*a*), the dielectric layer 110 and optional dielectric layer 100, and dielectric layer 20 and optional dielectric layer 10 are selectively removed. Conductors 140 and 60 and liners 130 and 50 are protected by the deposition of a passivating layer 150 (FIG. 4(*b*)). A self-aligned sidewall spacer 160 of dielectrics 110 and 20 and optional dielectrics 100 and 10 is again formed by this process. The removal of dielectric 20 may optionally proceed beneath the level of conductor 60 into substrate 40, as described above, as shown in FIG. 4(*c*). The removed dielectrics are preferably replaced by another dielectric 170 with properties different from removed dielectrics 110 and 20 and optional etch stops 10 and 100. In an alternate embodiment, prior to deposition of dielectric 170, passivating layer 150 may be removed.

Line-Up Dual Damascene

Figures 5, 5A, 5B, 5C:
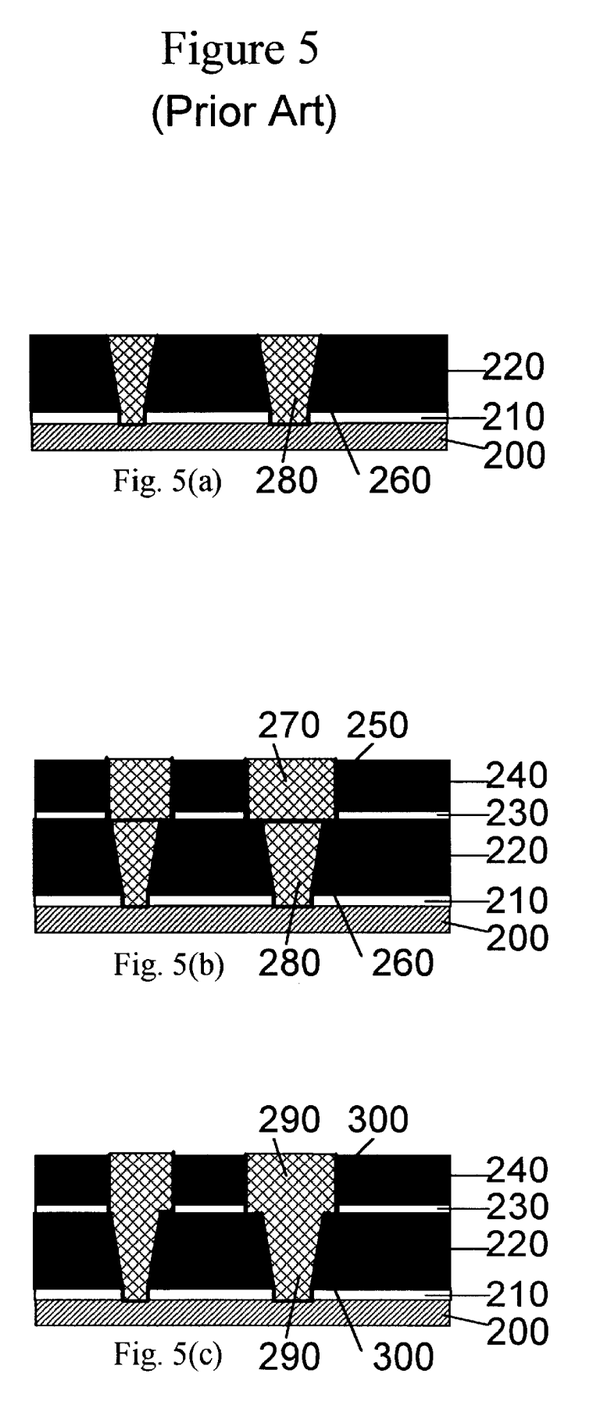
FIGS. 5a–5c are a process flow for the formation of a prior art line-up single and dual damascene structures.

This embodiment of the invention begins with a known structure consisting of two conducting layers built into a conventional dielectric material, as shown in FIGS. 5(*a*)–(*c*). One layer, the top layer, is a conducting layer consisting of lines of conductor, while the bottom layer consists of interconnections to vias formed beneath a conductor line layer.

Figures 6, 6A, 6B, 6C:
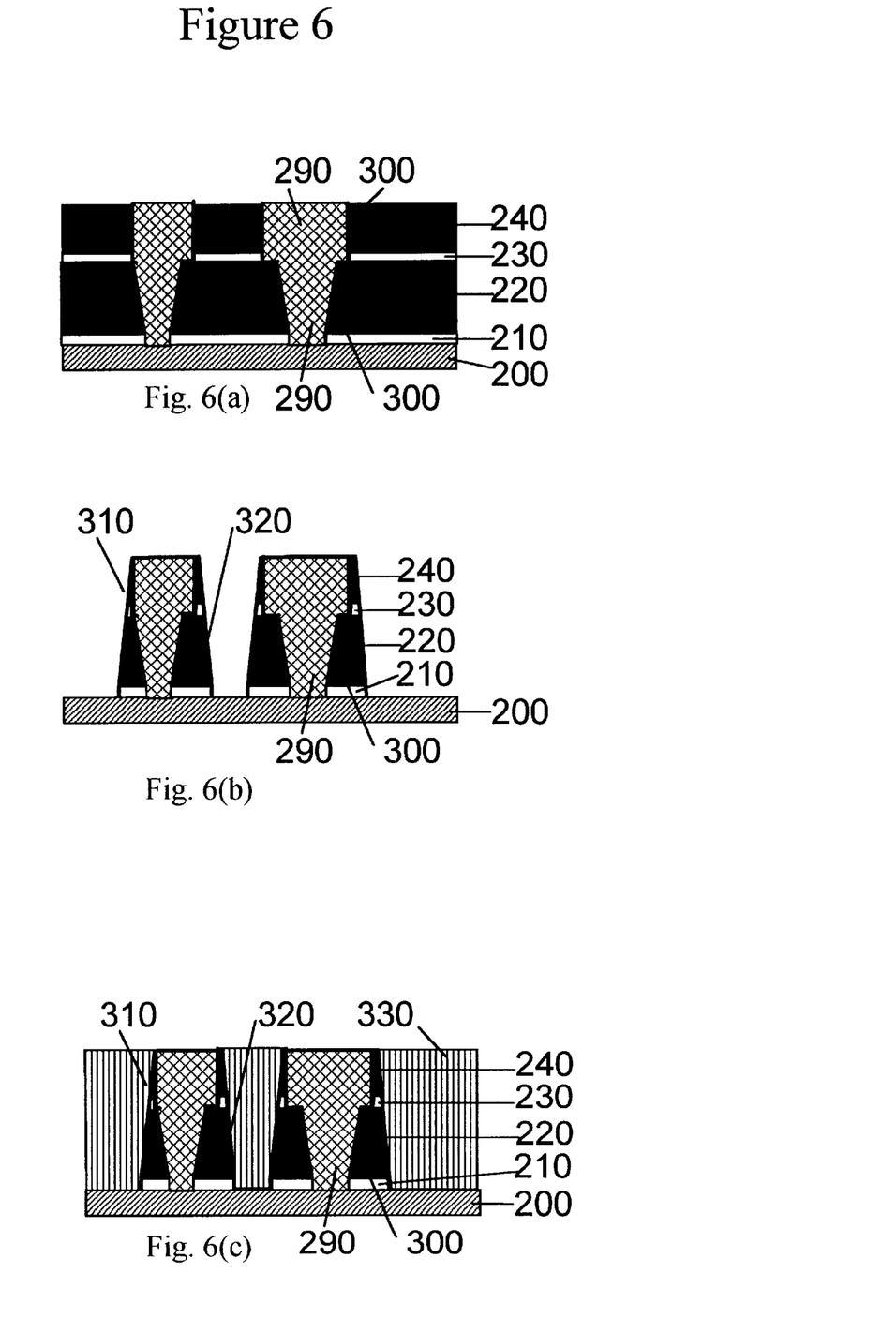
FIGS. 6a–6c are a process flow for the formation of a line-up dual damascene structure according to the invention.

The process flow begins in FIG. 5 and continues in FIG. 6. The initial structure is formed by depositing an optional etch stop layer 210, and via dielectric 220 onto the substrate 200. A photoresist pattern is transferred into dielectric 220 and optional etch stop 210. A liner 260 and conductor 280 are next deposited. The conductor 280 and liner 260 are then planarized via CMP to form the desired conductor pattern in layer 220 shown in FIG. 5(*a*).

Referring to FIG. 5(*b*), an optional etch stop layer 230, and line dielectric 240 are deposited onto the substrate 200 shown in FIG. 5(*a*). A photoresist pattern is transferred into the dielectric 240 and optional etch stop 230. The liner layer 250 and conductor layer 270 are then deposited. The conductor 270 and liner 250 are again planarized via CMP to form a desired conductor pattern in layer 240, as shown in FIG. 5(*b*). Other known methods may be used to form the two levels simultaneously such that conductors 270 and 280 are the same conductor 290, and liners 250 and 260 are the same liners 300, as shown in FIG. 5(*c*).

The process continues as shown in FIG. 6(*a*) to selectively remove dielectric 240 and optional dielectric 230, and dielectric 220 and optional dielectric 210. Conductor 290 and liner 300 are protected by the deposition of a passivating layer 310. A self-aligned sidewall spacer 320 of dielectrics 240 and 220 and optional dielectrics 230 and 210 is again formed by this process. The removal of dielectric 210 may optionally proceed beneath the level of conductor 290 into substrate 200, as shown in FIG. 6(*b*). The removed dielectrics are then replaced by another dielectric 330 with properties different from removed dielectrics 240 and 220 and optional etch stops 210 and 230. Again, as shown in FIG. 6(*c*), prior to deposition of dielectric 330, passivating layer 310 may be optionally removed.

High And Low Dielectric Constant Dielectrics

Figures 7, 7A:
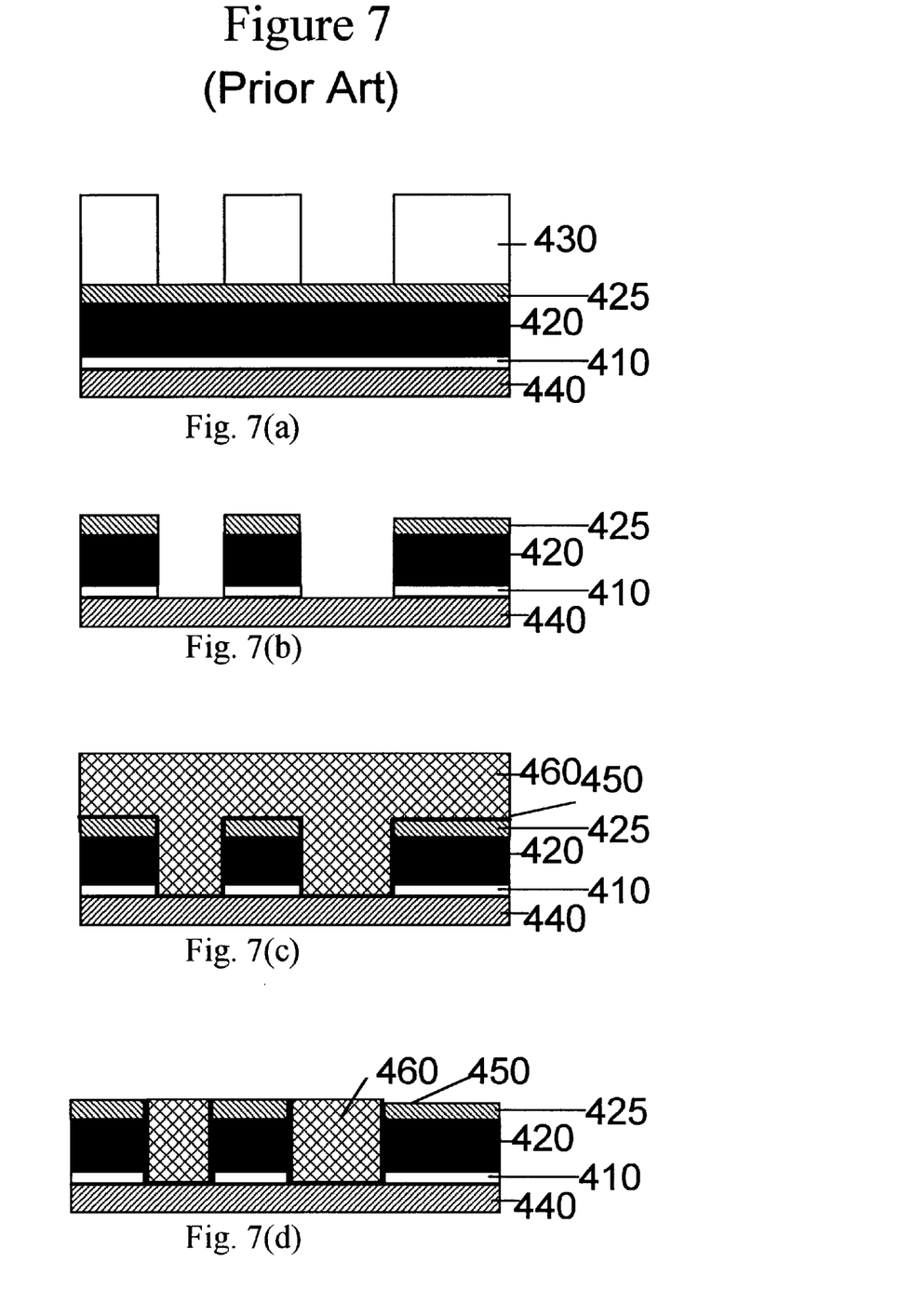
Figures 8, 8A, 8B, 8C:
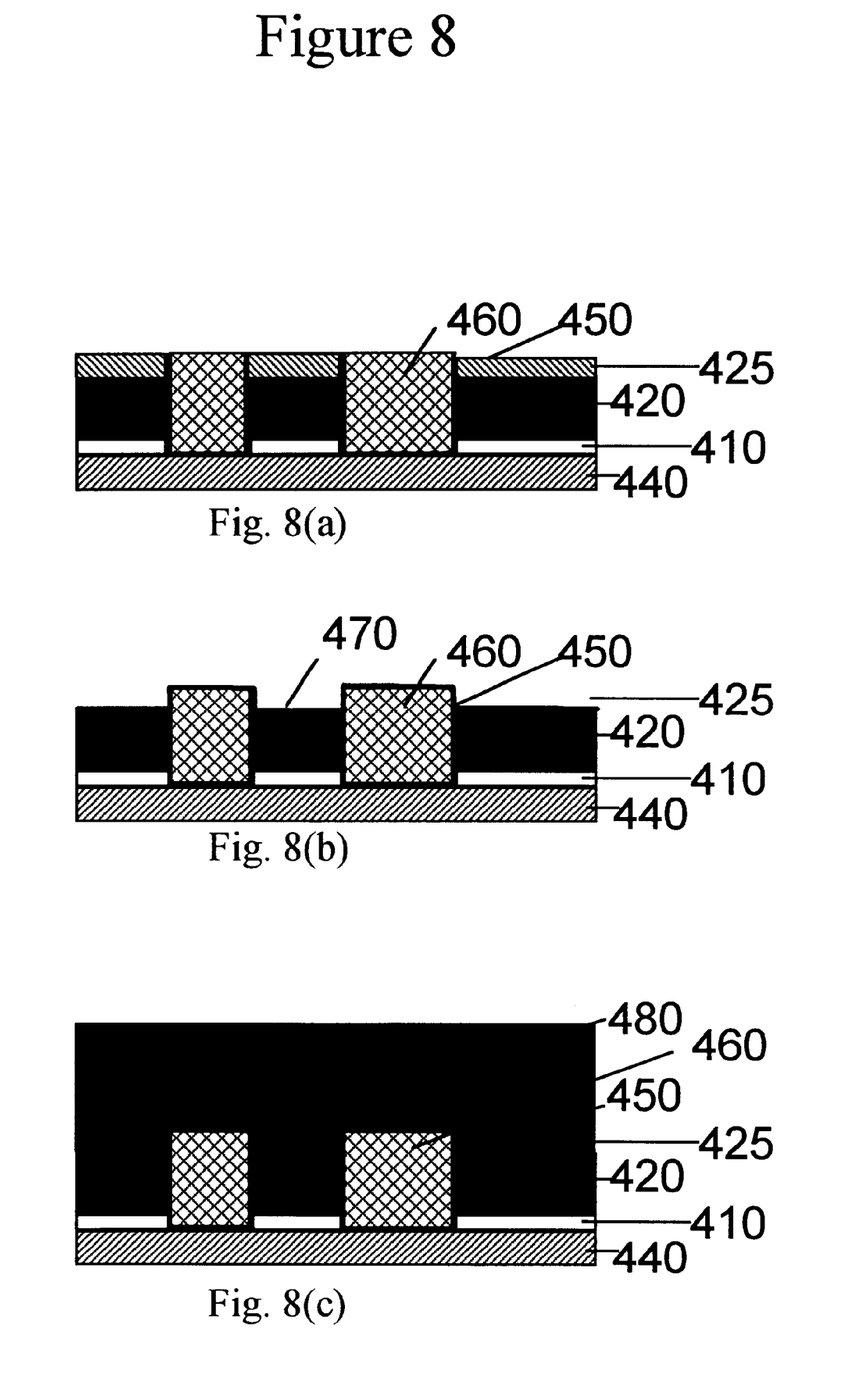
FIGS. 8a–8c are a process flow for the removal of the hard mask layer according to the invention.

A further embodiment of the invention uses the application of various films as processing aids to protect an underlying low dielectric constant material. The process of depositing and removing a hard mask layer dielectric having a higher dielectric constant than the underlying dielectric layer is illustrated in FIGS. 7 and 8. In the presently preferred embodiment of the process illustrated in FIGS. 7 and 8, the dielectric layer deposited can comprise any of the following materials: silicon dioxide, polyimide, organic siloxane polymer, poly-arlyene ether, carbon- or hydrogen-doped silicate glass or silsesquioxane glass, spin-on glass, fluorinated or non-fluorinated silicate glass, diamond like amorphous carbon, nano-porous silicate or organosilicate glass or silsesquioxane polymer, or any similar low dielectric constant material known in the art to be a useful dielectric material. Preferably, the hard mask layer comprises any of the dielectrics known in the art and listed above in the Background section.

Referring to FIG. 7, an optional etch stop layer 410 is first deposited onto a semiconductor substrate 440 in a manner generally known in the art. The etch stop layer 410 is followed the deposition of a dielectric layer 420, and then a hard mask layer 425 deposited on top of the dielectric layer 420. The resulting structure is patterned with photoresist 430, as shown in FIG. 7(*a*). The pattern from photoresist 430 is then transferred into the hard mask layer 425, the dielectric layer 420 and the optional etch stop layer 410, and the photoresist layer 430 is then stripped off, as shown in FIG. 7(b).

Layers of liner material 450 and conducting material 460 are then deposited, as shown in FIG. 7(c). The conducting layer 460 and liner layer 450 are planarized, preferably through a CMP process, to form the desired pattern of conductor in the layers of hard mask 425, insulating layer 420, and optional etch stop 410. The resulting known structure is shown in FIG. 7(d). Although a single damascene structure is shown in FIGS. 7 and 8, those skilled in the art will appreciate that the hard mask layer 425 can be used and applied with a dual damascene structure as well.

Beginning with the known structure illustrated in FIGS. 7(d) and 8(a), the hard mask layer 425 is then selectively removed without damaging the conductor layer 460, liner layer 450, or dielectric layer 420, as shown in FIG. 8(b). The passivating layer 470 is simultaneously deposited while the hard mask layer 425 is removed. The preferred process for removing the hard mask layer 420 and simultaneously depositing the passivating layer 470 is the same as disclosed above. The passivating layer 470 is then removed without oxidizing conductor layer 460, liner layer 450, or dielectric layer 420. In this case, the preferred method to remove the passivating layer is done in a capacitively-coupled reactive ion etch system such as one sold by Applied Materials of Santa Clara, Calif. under the name MxP using a mixture of 40 SCCM $NH_3$ and 40 SCCM $H_2$ at a pressure of 100 mT and a power of 100 Watts with a cathode temperature of 60° C. Once the passivating layer has been removed, a second low dielectric constant dielectric layer 480 can be deposited, as shown in FIG. 8(c).

It is to be understood that a wide range of changes and modifications to the embodiments described above will be apparent to those skilled in the art and are contemplated. It is therefore intended that the foregoing detailed description be regarded as illustrative, rather than limiting, and that it be understood that it is the following claims, including all equivalents, that are intended to define the spirit and scope of the invention.

We claim:

1. A method for etching a dielectric layer in a semiconductor integrated circuit fabrication process without damaging an underlying layer of metalization, comprising the steps of:
   patterning a dielectric layer deposited on top of a substrate;
   depositing a conducting layer of metalization within the patterned dielectric layer;
   planarizing the layer of metalization via a chemical mechanical polishing process; and
   depositing a passivating layer on top of the layer of metalization after the metalization has been planarized and simultaneously etching the dielectric layer without damaging the conducting layer of metalization.

2. The method defined in claim 1, further comprising the step of depositing an etch stop layer prior to depositing the dielectric layer.

3. The method defined in claim 2, wherein the step of etching the dielectric layer proceeds to a stop point defined by the etch stop layer.

4. The method defined in claim 1, wherein the step of etching the dielectric layer proceeds to a level of the underlying layer of metalization.

5. The method defined in claim 1, wherein the step of etching the dielectric layer proceeds to a level below the underlying layer of metalization.

6. The method defined in claim 1, further comprising the step of patterning the dielectric layer through the use of a photoresist pattern.

7. The method defined in claim 1, wherein the step of etching the dielectric layer comprises the step of plasma etching.

8. The method defined in claim 7, wherein the plasma etch consists of a mixture of feed gases.

9. The method defined in claim 8, wherein the mixture of feed gases comprises Ar, $C_2F_6$, and cyclo-$C_4F_8$.

10. The method defined in claim 1, further comprising the step of forming a self-aligned side wall spacer formed from the dielectric layer.

11. The method defined in claim 1, wherein the etched dielectric is replaced by another dielectric layer having different properties.

12. The method defined in claim 11, wherein the different properties comprise having a lower dielectric constant.

13. The method defined in claim 1, wherein the conductor layer of metalization is encased with carbon and fluorine bound in various chemical forms.

14. The method defined in claim 1, further comprising the step of depositing a liner layer before deposition of the conducting layer of metalization.

15. The method defined in claim 1, wherein the dielectric layer comprises silicon dioxide.

16. The method defined in claim 14, wherein the liner layer comprises tantalum.

17. The method defined in claim 14, wherein the liner layer comprises tantalum nitride.

18. The method defined in claim 14, wherein the liner layer comprises tantalum and tantalum nitride.

19. The method defined in claim 1, wherein the metalization layer comprises copper.

20. The method defined in claim 1, further comprising the step of removing the passivating layer without damaging the metalization and liner layers.

21. A method for etching a dielectric layer in a semiconductor integrated circuit fabrication process without damaging an underlying layer of metalization, comprising the steps of:
   depositing a first dielectric on top of a semiconductor substrate, the first dielectric having a low dielectric constant;
   depositing a second dielectric on top of the first dielectric, the second dielectric having a dielectric constant higher than the first dielectric;
   patterning the first and second dielectrics;
   depositing a conducting layer of metalization within the patterned first and second dielectrics;
   planarizing the layer of metalization via a chemical mechanical polishing process; and depositing a passivating layer on top of the layer of metalization after the metalization has been planarized and simultaneously etching the second dielectric without damaging the conducting layer of metalization.

22. The method defined in claim 21, further comprising the step of depositing an etch stop layer prior to depositing the first dielectric.

23. The method defined in claim 21, wherein the etched second dielectric is replaced by a third dielectric having a lower dielectric constant.

24. The method defined in claim 21, further comprising the step of depositing a liner layer before deposition of the conducting layer of metalization.

25. The method defined in claim 24, wherein the liner layer comprises tantalum.

26. The method defined in claim 24, wherein the liner layer comprises tantalum nitride.

27. The method defined in claim 24, wherein the liner layer comprises tantalum and tantalum nitride.

28. The method defined in claim 21, wherein the metalization layer comprises copper.

29. The method defined in claim 21, further comprising the step of removing the passivating layer without damaging the metalization and liner layer.

* * * * *